United States Patent
Pranatharthi Haran et al.

(10) Patent No.: US 11,302,637 B2
(45) Date of Patent: Apr. 12, 2022

(54) INTERCONNECTS INCLUDING DUAL-METAL VIAS

(71) Applicant: International Business Machines Corporation, Armonk, NY (US)

(72) Inventors: Balasubramanian S. Pranatharthi Haran, Watervliet, NY (US); Devika Sil, Rensselaer, NY (US); Takeshi Nogami, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/993,340

(22) Filed: Aug. 14, 2020

(65) Prior Publication Data
US 2022/0051976 A1     Feb. 17, 2022

(51) Int. Cl.
| | |
|---|---|
| *H01L 23/528* | (2006.01) |
| *H01L 23/522* | (2006.01) |
| *H01L 21/768* | (2006.01) |
| *H01L 21/3213* | (2006.01) |

(52) U.S. Cl.
CPC .... *H01L 23/5283* (2013.01); *H01L 21/32134* (2013.01); *H01L 21/76816* (2013.01); *H01L 21/76877* (2013.01); *H01L 21/76892* (2013.01); *H01L 23/5226* (2013.01)

(58) Field of Classification Search
CPC .............. H01L 23/5283; H01L 23/5226; H01L 21/76877; H01L 21/76892; H01L 21/32134; H01L 21/76816
See application file for complete search history.

(56) References Cited

U.S. PATENT DOCUMENTS

| | | |
|---|---|---|
| 8,357,609 B2 | 1/2013 | Ryan |
| 9,601,426 B1 | 3/2017 | Bonilla et al. |
| 9,793,163 B2 | 10/2017 | Bristol et al. |
| 9,859,215 B1 | 1/2018 | Edelstein et al. |
| 9,859,433 B1 | 1/2018 | Edelstein et al. |
| 10,128,185 B2 | 11/2018 | Bruce et al. |
| 10,177,028 B1 | 1/2019 | Licausi et al. |
| 10,177,031 B2 | 1/2019 | Bao et al. |
| 2012/0161320 A1 | 6/2012 | Akolkar et al. |
| 2015/0056800 A1 | 2/2015 | Mebarki et al. |
| 2017/0040213 A1 | 2/2017 | Bruce et al. |
| 2019/0206733 A1 | 7/2019 | Lin et al. |
| 2020/0411431 A1* | 12/2020 | Huang .............. H01L 21/76883 |

* cited by examiner

*Primary Examiner* — Shahed Ahmed
*Assistant Examiner* — Vicki B. Booker
(74) *Attorney, Agent, or Firm* — Cantor Colburn LLP; L. Jeffrey Kelly

(57) ABSTRACT

An integrated circuit (IC) structure includes a dielectric layer extending along a first axis to define a length and a second axis orthogonal to the first axis to define a width. A dual-metal via is embedded in the dielectric layer. The dual-metal via includes via sidewalls surrounding a via core. An electrically conductive line extends along the first axis and on an upper surface of the dual-metal via. A side portion of the via core is co-planar with a sidewall of the electrically conductive line.

12 Claims, 11 Drawing Sheets

INTERCONNECTS INCLUDING DUAL-METAL VIAS

BACKGROUND

The present invention generally relates to fabrication methods and resulting structures for integrated circuits (ICs), and more specifically, to fabrication methods and resulting IC interconnect structures containing dual-metal vias.

ICs (also referred to as a chip or a microchip) include electronic circuits on a wafer. The wafer is a semiconductor material, such as, for example, silicon or other materials. An IC includes a large number of individual devices formed on the wafer. The individual devices, such as transistors, capacitors, resistors, etc. are formed in earlier layers of the IC known as front-end-of-line (FEOL) layers.

The back-end-of-line (BEOL) is the stage of IC fabrication where conductive wiring interconnect networks are established to form interconnect structures that interconnect FEOL devices with one another. Typically, the wiring interconnect networks include two types of interconnect elements (often referred to as interconnects) that serve as electrical conductors, namely, conductive lines that traverse a distance across the chip, and conductive vias that connect the conductive lines at different levels (typically referred to as metallization layers). The conductive lines and conductive vias are made of a conductive material, such as aluminum or copper, and are electrically insulated by interlayer dielectrics (ILD).

Various non-limiting embodiments of the invention provide a method of fabricating an integrated circuit (IC). The method comprises forming a plurality of first dual-metal vias in a dielectric layer extending along a first axis to define a length and a second axis orthogonal to the first axis to define a width, a first dual-metal via among the plurality of first dual-metal vias separated from a second dual-metal via among the plurality of first dual-metal vias by a distance extending along the second axis. The method further comprises forming a plurality of electrically conductive lines on the dielectric layer, a first electrically conductive line extending along the first axis and on an upper surface of the first dual-metal via and second electrically conductive line extending along the first axis and on an upper surface of the second dual-metal via. The method further comprises etching a portion of the first dual-metal via to increase the distance separating the first dual-metal via from a second dual-metal via.

Various non-limiting embodiments of the invention provide an integrated circuit (IC). An integrated circuit (IC) structure includes a dielectric layer extending along a first axis to define a length and a second axis orthogonal to the first axis to define a width. A dual-metal via is embedded in the dielectric layer. The dual-metal via includes via sidewalls surrounding a via core. An electrically conductive line extends along the first axis and on an upper surface of the dual-metal via. A side portion of the via core is co-planar with a sidewall of the electrically conductive line.

Various non-limiting embodiments of the invention provide a method of fabricating an integrated circuit (IC). The method comprises forming first and second first dual-metal vias in a dielectric layer that extends along a first axis to define a length and a second axis orthogonal to the first axis to define a width, the first dual-metal via separated from the second dual-metal via by a distance extending along the second axis. The first and second dual-metal vias each include an inner core and sidewalls surrounding the inner core. The method further comprises forming a first electrically conductive line extending along the first axis and on an upper surface of the first dual-metal via and second electrically conductive line extending along the first axis and on an upper surface of the second dual-metal via. The method further comprises etching a portion of the sidewalls selective to the inner core to increase the distance between the first dual-metal via and the second electrically conductive line.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

(FIGS.) 1A-8B are a series of views illustrating a method of fabricating an IC structure according to non-limiting embodiments of the invention, in which.

Figure 1A:
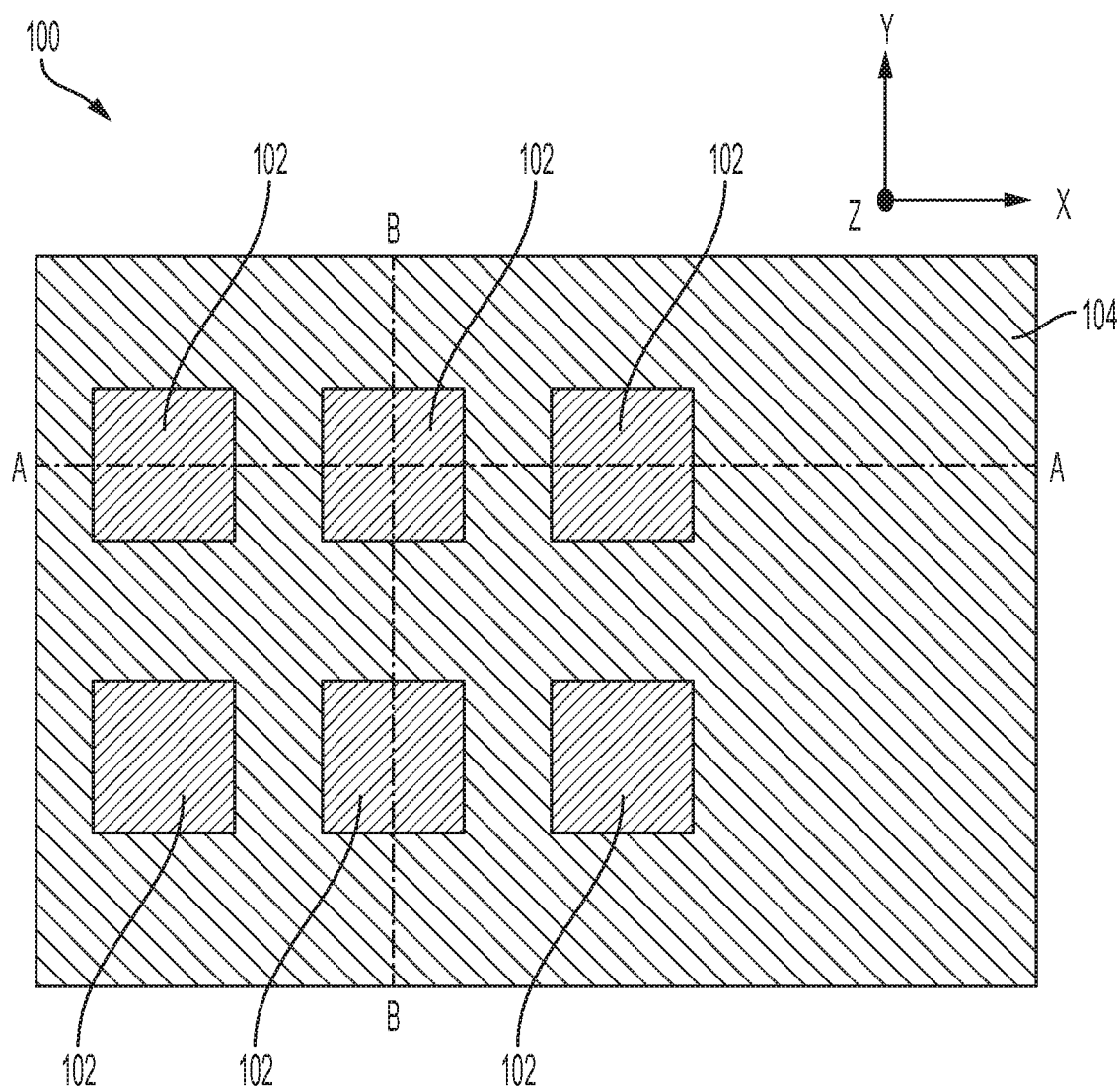
FIG. 1A is a top view of an IC structure at an intermediate stage of a fabrication process according to a non-limiting embodiment of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular interconnect architecture, embodiments of the invention are not limited to the particular interconnect architectures or materials described in this specification. Rather, embodiments of the present invention are capable of being implemented in conjunction with any other type of interconnect architecture or materials now known or later developed, wherein it is desirable to meet critical dimensions while providing overlay tolerances.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of S/D regions, as well as the deposition of metal contacts, can occur during the MOL stage to connect the elements patterned during the FEOL stage.

Layers of interconnections (e.g., metallization layers) can include one or more conductive lines and/or one or more conductive vias. The conductive lines are formed above the logic and functional layers during the BEOL stage to complete the IC. Most ICs need more than one metallization layer, and as many as 5-12 layers can be formed in the BEOL process. The various layers and/or individual conductive lines are interconnected by conductive vias. The combination of conductive lines and conductive vias form a wiring interconnect network that establishes the necessary connections of the interconnect structure.

Insulating dielectric materials are used throughout the layers of an IC to perform a variety of functions, including stabilizing the IC structure and providing electrical isolation of the IC elements. For example, one or more conductive lines in the BEOL region of the IC are isolated by dielectric layers to prevent the conductive lines from creating a short circuit. One or more conductive vias are typically formed in the higher-level dielectric layer to establish a connection between a conductive line formed at a first layer and another conductive line formed at a second layer.

The continued trend to reduce the footprint of semiconductor devices has led to concerns pertaining to reliability issues driven by poor overlay and lack of alignment between trench and vias. Overlay errors can result from misalignments occurring during the lithography process as the mask invariably can, under certain circumstances, not be perfectly aligned to the underlying structure. One key failure mode caused by line-to-via misalignment is time dependent dielectric breakdown (TDDB). TDDB is a failure mode whereby the insulating materials or layers no longer serve as adequate electrical insulators resulting in unintended conductance between two adjacent metal features. This phenomenon is highly dependent upon the electrical field between the metal features as regions with higher electrical fields are more susceptible to TDDB failure. Consequently, it is critical to reduce line-to-via overlay alignment in order to control the spacing between conducting metal elements (e.g., adjacent metal lines and/or metal vias) and maintain electrical fields at tolerable levels.

One or more non-limiting embodiments of the invention described herein provide fabrication methods and resulting interconnect structures containing dual-metal vias. In accordance with aspects of the invention, the dual-metal vias include a first metal that lines the sidewalls and base of the via trench, while a second fills the remaining via trench to form the via core. Employing two different types of metal allows for etching the sidewall of the dual-metal via selective to the via core. In this manner, the distance between adjacent interconnect elements can be increased to achieve tolerable electrical fields levels as fabrication trends continue to reduce the footprints of ICs.

Figure 1B:
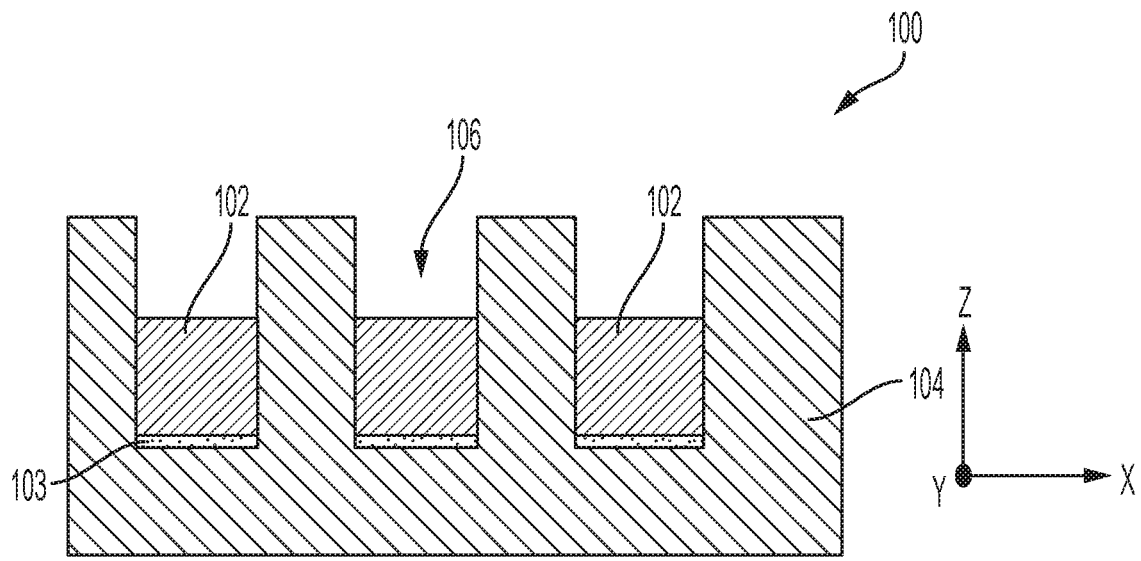
FIG. 1B is a first cross-sectional view of the IC structure illustrated in FIG. 1A taken along line A-A according to a non-limiting embodiment of the invention.
Figure 1C:
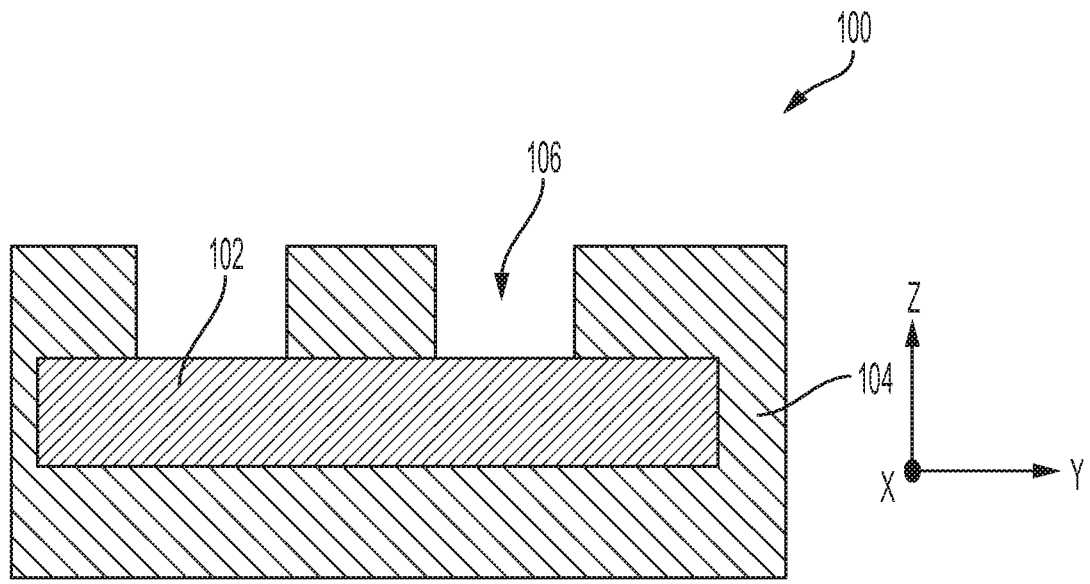
FIG. 1C is a second cross-sectional view of the IC structure illustrated in FIG. 1A taken along line B-B according to a non-limiting embodiment of the invention.

With reference now to FIGS. 1A, 1B and 1C, an intermediate IC structure 100 is illustrated following one or more processing operations according to one or more embodiments of the invention. In the present specification and claims, an "intermediate" IC structure is defined as an IC structure in a stage of fabrication prior to a final stage. The IC structure 100 extends along a first axis (e.g., an X-axis) to define a horizontal length, a second axis (e.g., a Y-axis) orthogonal to the first axis to define a horizontal width, and a third axis (e.g., a Z-axis) orthogonal to the first and second axes to define a vertical width. In one or more embodiments of the invention, the IC structure 100 is multi-layered and integrated therein can include FEOL layers, MOL layers, and BEOL layers.

Known fabrication operations have been used to form the intermediate IC structure 100 such that it includes one or more first-level lines 102 formed in a dielectric layer 104. Although the first-level lines 102 are described, it should be appreciated that the first-level lines 102 can also include conductive vias (not shown) without departing from the scope of the invention. The conductive lines 102 extend along the X-axis to define a horizontal line length, the Y-axis to define a horizontal line width, and the Z-axis to define a vertical line height. A liner 103 can be interposed between the dielectric layer 104 and a conductive line 102.

The dielectric layer 104 (sometimes referred to as an interlayer dielectric (ILD)) serves as an isolation structure for the electrically conductive elements formed therein (e.g., conductive lines, via, etc.). The dielectric layer 104 can be made of any suitable dielectric material, such as, for example, low-k dielectrics (materials having a small dielectric constant relative to silicon dioxide, i.e., less than about 3.9), porous silicates, carbon doped oxides, silicon dioxides, silicon nitrides, silicon oxynitrides, silicon carbide (SiC), or other dielectric materials. Any known manner of forming the dielectric layer 104 can be utilized, such as, for example, CVD, PECVD, ALD, flowable CVD, spin-on dielectrics, or PVD.

The conductive lines 102 can be formed using standard lithography and patterning techniques. For example, as best shown in FIGS. 1B and 1C, wafer openings can be etched into the dielectric layer 104 then filled with a conductive material to form the conductive lines 102. In one or more embodiments of the invention, the wafer openings can be overfilled such that an excess amount of the conductive material is formed on an upper surface of the dielectric layer 104. Thereafter, a chemical mechanical polishing/planarization (CMP) process can be performed to remove the excess conductive material formed on the upper surface of the dielectric layer 104. Additional ILD material is deposited over the IC structure 100 such that the dielectric layer 104 substantially covers the conductive lines 102. The dielectric layer 104 is planarized then a top surface of the dielectric layer 104 is patterned and etched to generate openings 106 that expose and provide access to top surface regions of the conductive lines 102. The conductive material used to form the conductive lines 102 can include, for example, metal. The metal includes, but is not limited to, copper (Cu), cobalt (Co), aluminum (Al), tungsten (W), tungsten cobalt (WCo), ruthenium (Ru), nickel (Ni), zirconium (Zr), platinum (Pt), iridium (Jr), niobium (Nb), molybdenum (Mo), etc.

Figure 2A:
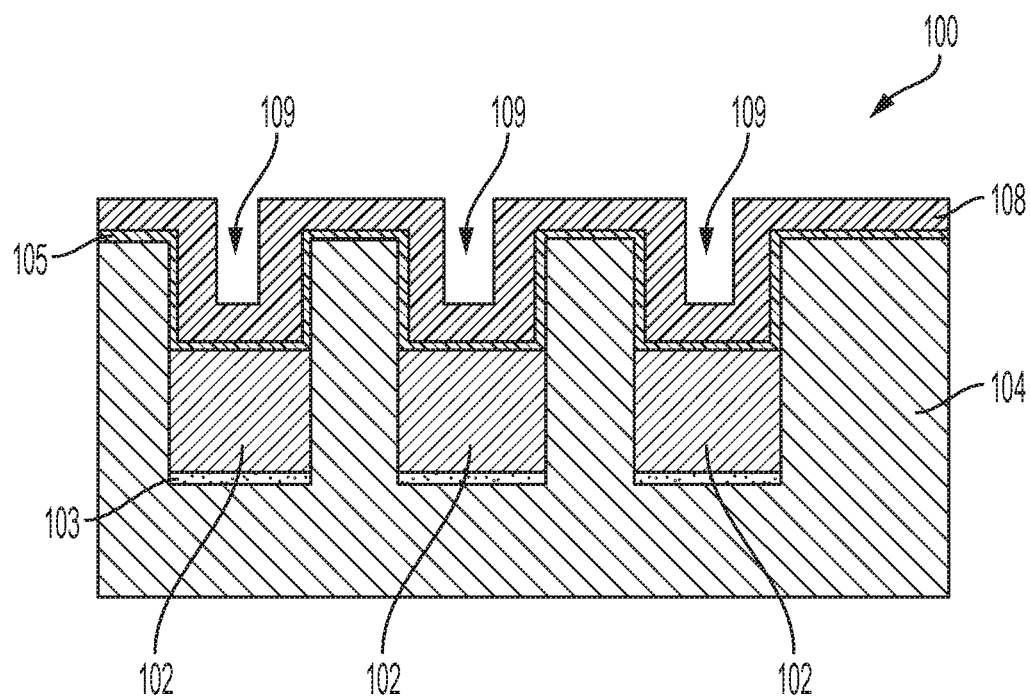
FIG. 2A illustrates the IC structure in the first cross-section view following deposition of a first metal according to a non-limiting embodiment of the invention.
Figure 2B:
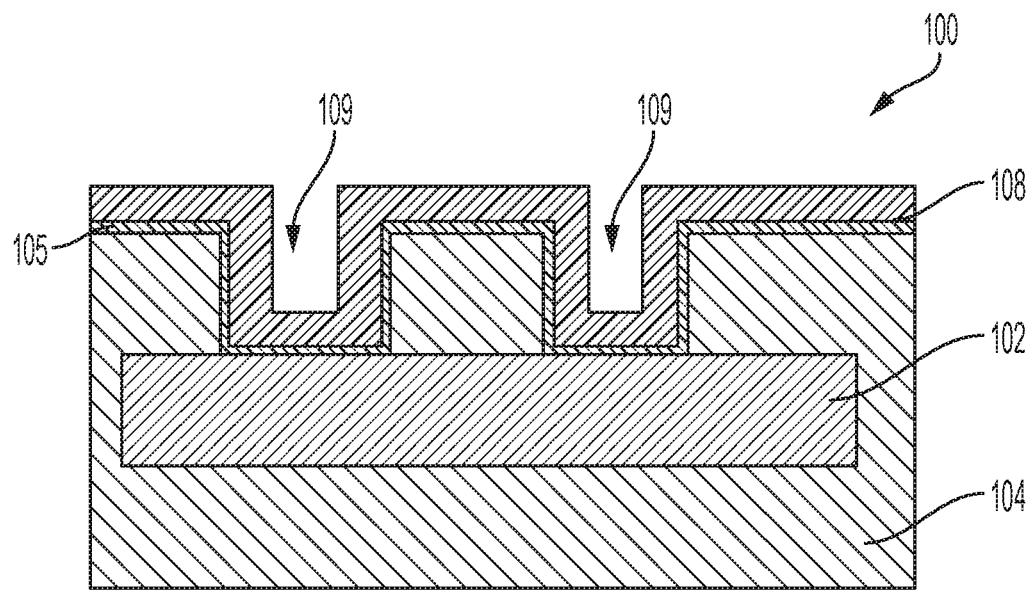
FIG. 2B illustrates the IC structure of FIG. 2A in the second cross-section view according to a non-limiting embodiment of the invention.

FIGS. 2A and 2B depict the IC structure 100 along the first cross-section view (i.e., line A-A of FIG. 1A) and the second cross-section view (i.e., line B-B of FIG. 1A) after fabrication operations in accordance with embodiments of the invention. As illustrated, a layer of a first metal 108 is blanket deposited on the upper surface of the dielectric layer 104 and within the openings 106 (shown in FIGS. 1B and 1C). A liner 105 can be interposed between a conductive line and the first metal 108. The first metal 108 includes a metal such as, for example, tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The thickness of the first metal 108 ranges, for example, from about 0.5 nanometers (nm) to about 3 nm so as to conform to the sidewalls of the dielectric layer 104 and the upper surface of the conductive lines 102. Accordingly, an opening 109 is formed in the first metal 108.

Figure 3A:
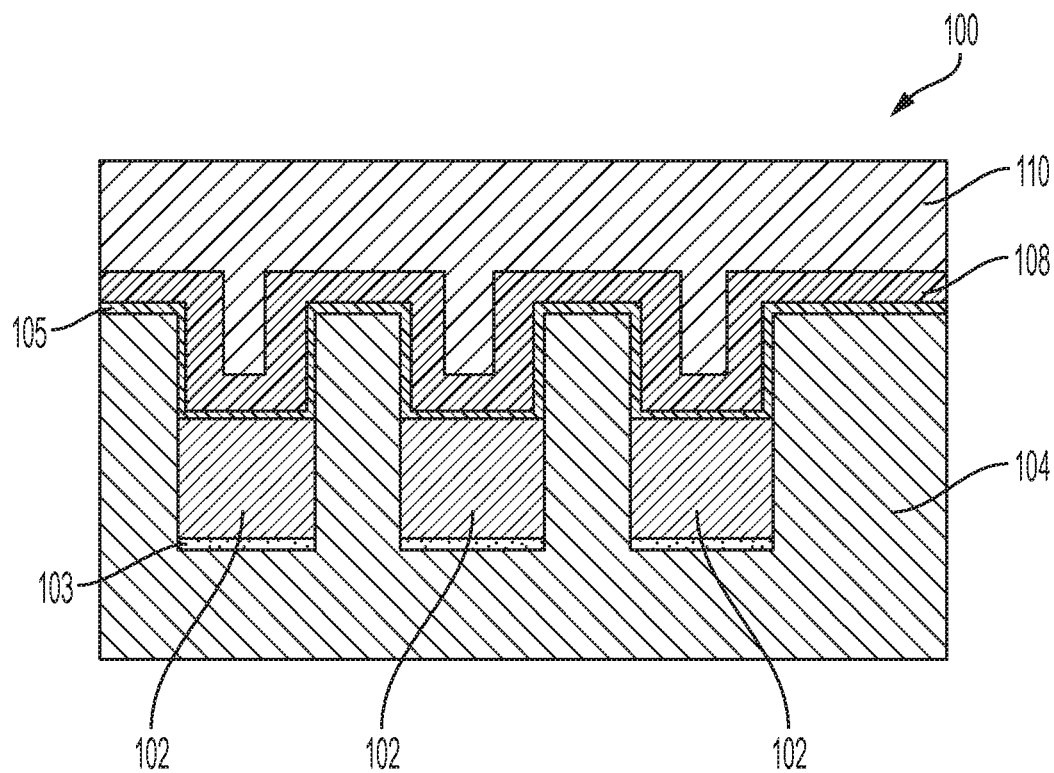
FIG. 3A illustrates the IC structure in the first cross-section view following deposition of a second metal on the first metal according to a non-limiting embodiment of the invention.
Figure 3B:
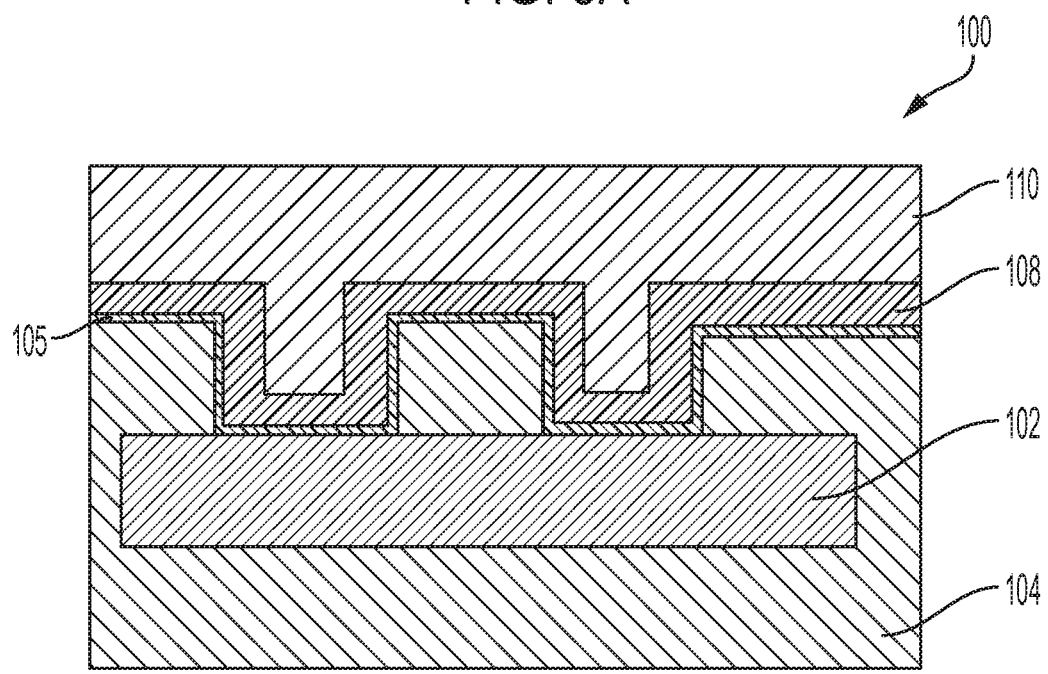
FIG. 3B illustrates the IC structure of FIG. 3B in the second cross-section view according to a non-limiting embodiment of the invention.

FIGS. 3A and 3B depict the IC structure 100 along the first cross-section view (i.e., line A-A of FIG. 1A) and the second cross-section view (i.e., line B-B of FIG. 1A) after fabrication operations in accordance with embodiments of the invention. As illustrated, a layer of a second metal 110 is blanket deposited on the upper surface of the first metal 108. The second metal 110 includes, for example, copper (Cu), cobalt (Co), ruthenium (Ru), zirconium (Zr), aluminum (Al), platinum (Pt), niobium (Nb), molybdenum (Mo), tungsten (W), tungsten cobalt (WCo), nickel (Ni), and iridium (Ir). In one or more non-limiting embodiments, the second metal 110 matches the metal of the conductive lines 102. The second metal 110 is deposited to fill (or pinch off in) the openings 109 (shown in FIGS. 2A and 2B). In one or more embodiments of the invention, the openings 109 can be overfilled above the upper surface of the first metal 108.

Figure 4A:
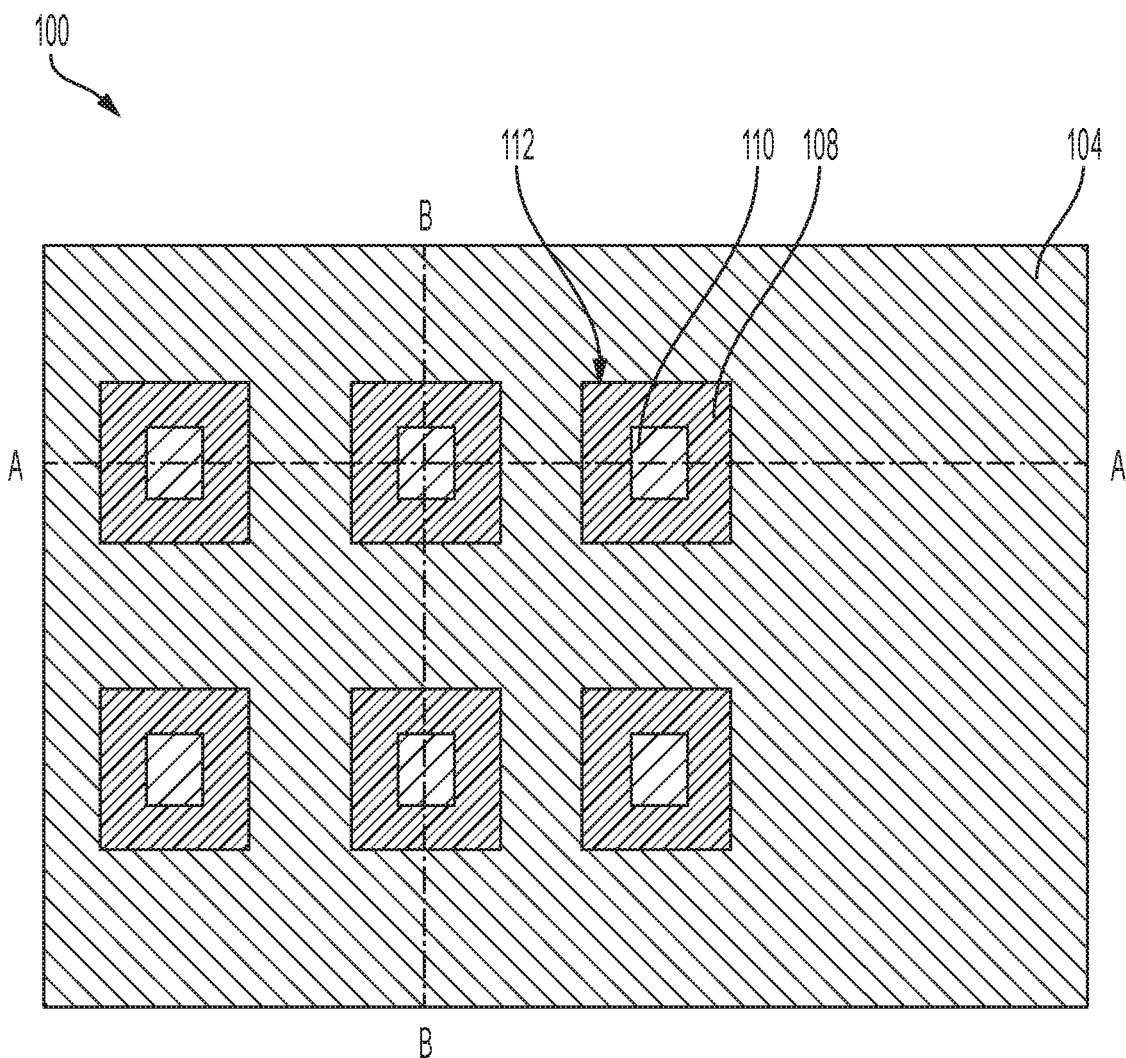
FIG. 4A illustrates the IC structure in the top view after planarizing the first and second metals to form dual-metal conductive vias according to a non-limiting embodiment of the invention.
Figure 4B:
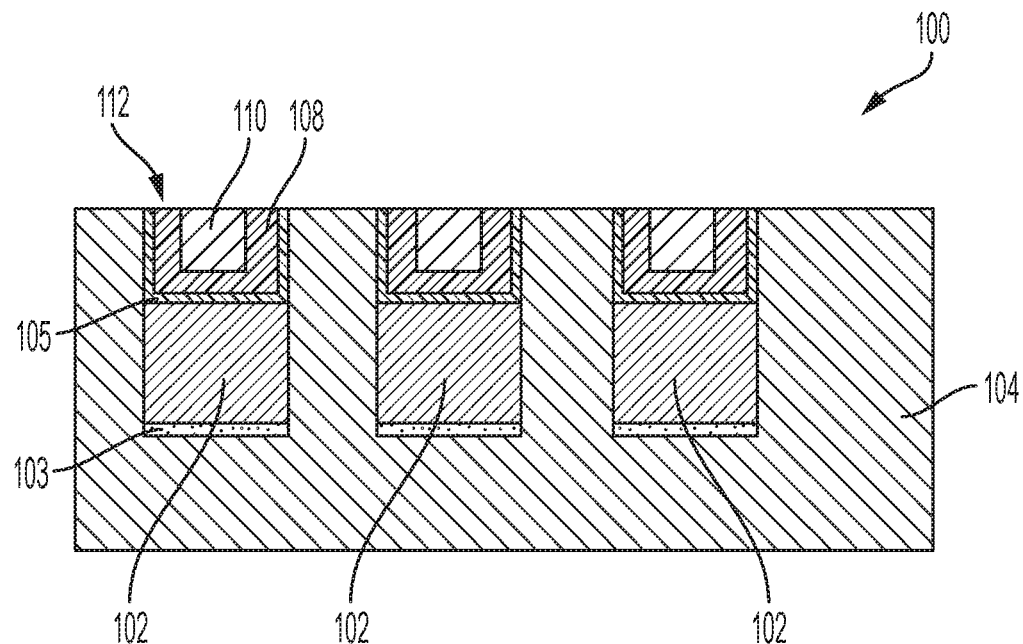
FIG. 4B illustrates the IC structure in the first cross-section view according to a non-limiting embodiment of the invention.
Figure 4C:
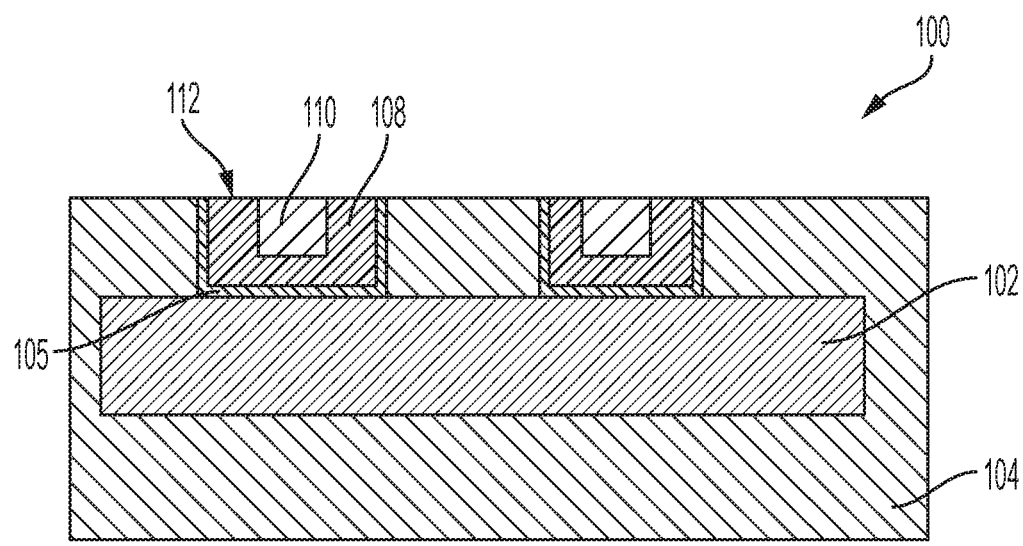
FIG. 4C illustrates the IC structure in the second cross-section view according to a non-limiting embodiment of the invention.

FIG. 4A depicts a top-down view of the IC structure 100, FIG. 4B depicts the IC structure 100 along a first cross-section view (i.e., line A-A of FIG. 4A), and FIG. 4C depicts the IC structure 100 along a second cross-section view (i.e., line B-B of FIG. 4A), all of which are after fabrication operations in accordance with embodiments of the invention. As best shown in FIGS. 4A and 4C, a CMP operation has been applied to the IC structure 100. The CMP process can be performed until the upper surface of the dielectric layer 104 is re-exposed. Accordingly, the remaining portion of the first metal 108 fills the openings 106 (shown in FIGS. 1B and 1C), and the remaining portion of the second metal 110 fill the openings 109 (shown in FIGS. 2A and 2B), with each having upper surfaces that are flush (i.e., co-planar) with respect to the upper surface of the dielectric layer 104.

As best shown in FIGS. 4B and 4C, the remaining portions of the first metal 108 and second metal 110 form a dual-metal via 112. As described herein, forming the dual-metal via 112 from two different types of metals facilitates a downstream fabrication process that allows for etching the first metal 108, selective to the second metal 110. In this manner, the etched first metal 108 can define a sidewall of the dual-metal via 112, while the etched second metal 110 can define a core of the dual-metal via 112.

Figure 5A:
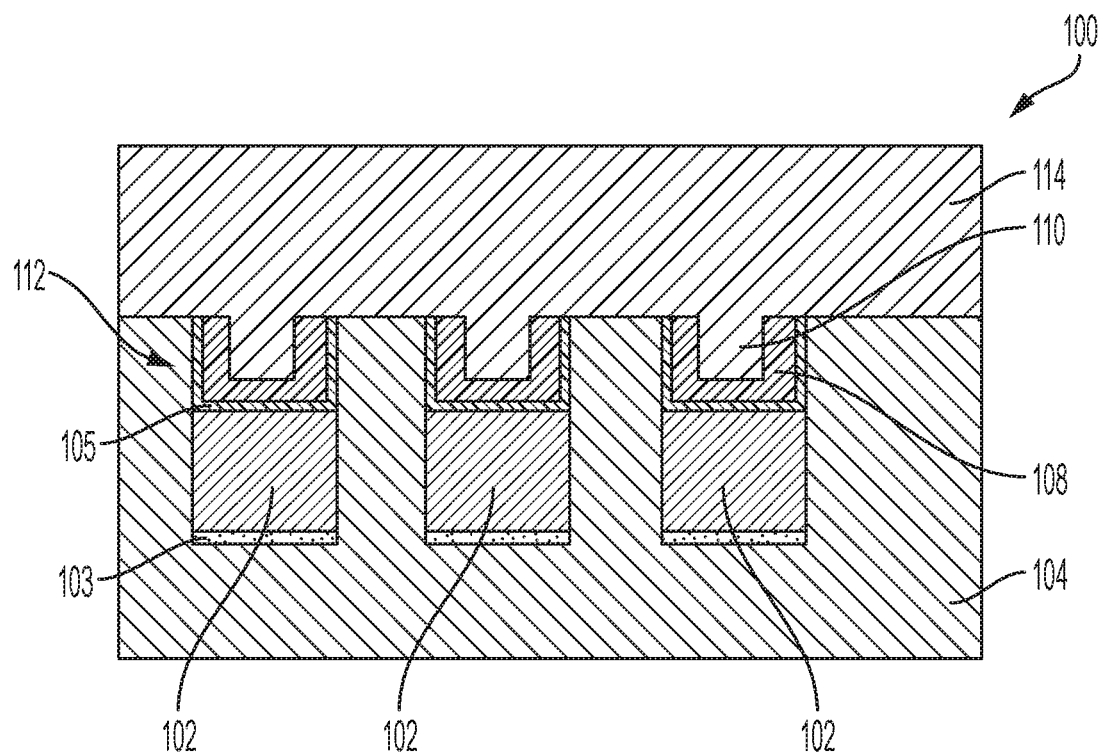
FIG. 5A illustrates the IC structure in the first cross-section view following deposition of a third metal according to a non-limiting embodiment of the invention.
Figure 5B:
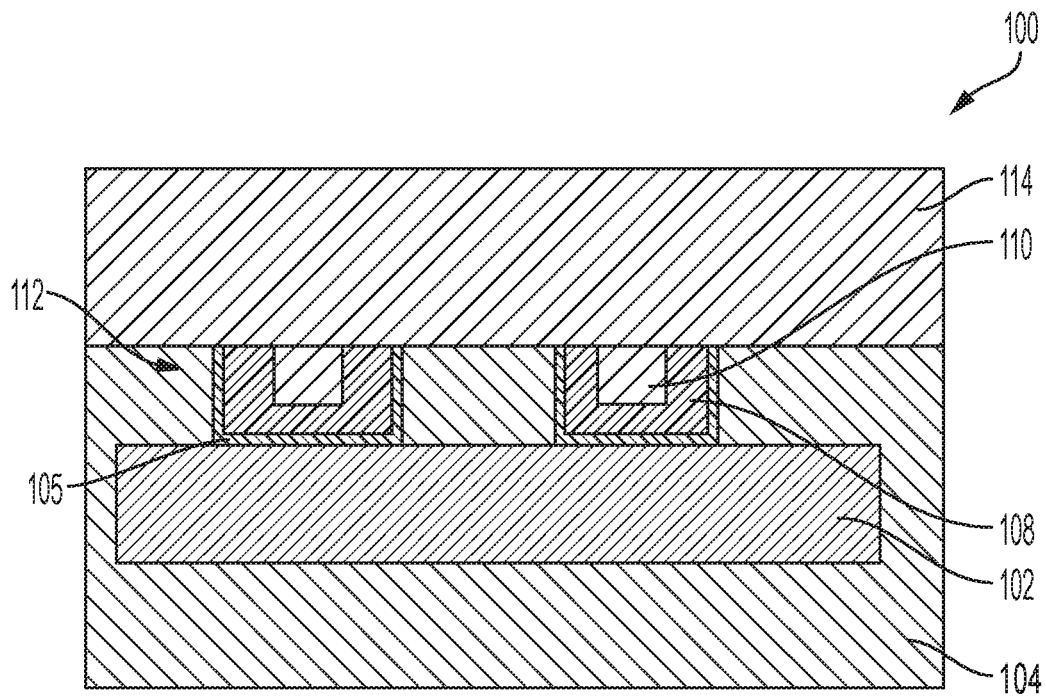
FIG. 5B illustrates the IC structure of FIG. 5A in the second cross-section view according to a non-limiting embodiment of the invention.

FIGS. 5A and 5B depict the IC structure 100 along the first cross-section view (i.e., line A-A of FIG. 4A) and the second cross-section view (i.e., line B-B of FIG. 4A) after fabrication operations in accordance with embodiments of the invention. As illustrated, a third metal 114 has been deposited on the upper surface of the dielectric layer 104. Accordingly, the third metal 114 completely covers and directly contacts the dual metal vias 112 (i.e., the upper surfaces of the first metal 108 and the second metal 110). The third metal 114 includes, but is not limited to, copper (Cu), cobalt (Co), ruthenium (Ru), zirconium (Zr), aluminum (Al), platinum (Pt), niobium (Nb), molybdenum (Mo), tungsten (W), tungsten cobalt (WCo), nickel (Ni), and iridium (Jr). In embodiments of the invention, the third metal 114 includes the same metal used to form the second metal 110 (i.e., the third metal 114 matches the second metal 110). In embodiments of the invention, however, the third metal 114 includes a metal that is different from the metal of the second metal 110 without departing from the scope of the invention.

For example, line pattern elements (not shown) can be formed on an upper surface of a masking layer (not shown) that covers the third metal 114. The masking layer can include various materials including, but not limited to, silicon nitride (SiN). Formation of the pattern elements can include blanket depositing a pattern material (not shown) on an upper surface of the masking layer and etching the pattern material to form the pattern elements. The pattern material can include for example, organic resist coatings or patterning layers, and can be formed on the masking layer using spin coating process. The pattern elements formed after etching the pattern material extend along the X-axis above one or more of the dual-metal vias 112, and can be formed as any shape, such as, for example, a square, a rectangle, or a circle.

In one or more embodiments of the invention, patterning the masking material may result in pattern elements that are misaligned (i.e., offset) with respect to the underlying dual-metal vias 112. For example, the patterned elements may be misaligned with respect to the first metal 108 defining the sidewalls of the dual-metal vias 112. This misalignment or offset can cause lack of proper alignment of the resulting metal lines as described in greater detail below.

Figure 6A:
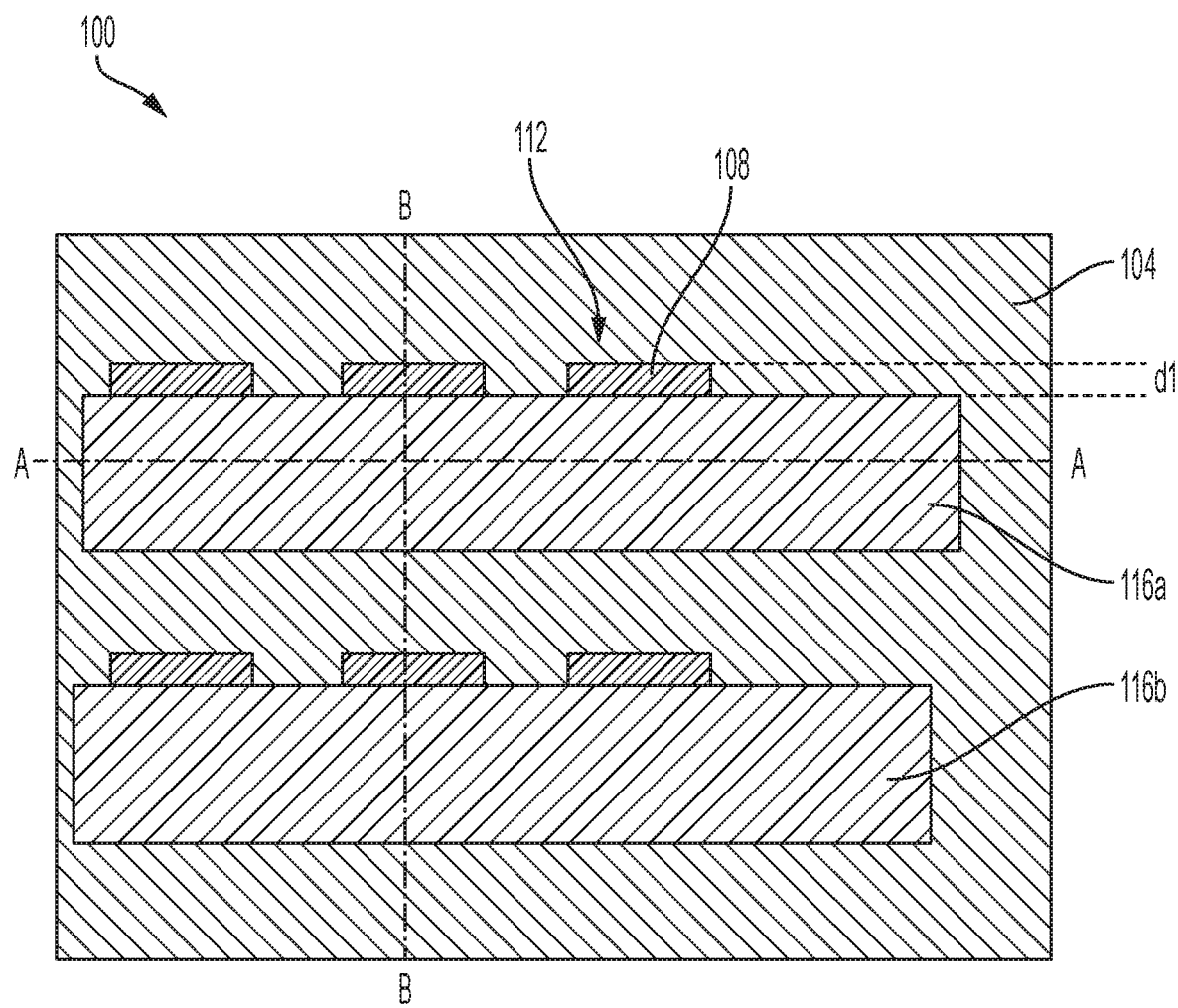
FIG. 6A illustrates the IC structure in the top view after forming metal lines on an upper surface of the dual-metal conductive vias according to a non-limiting embodiment of the invention.
Figure 6B:
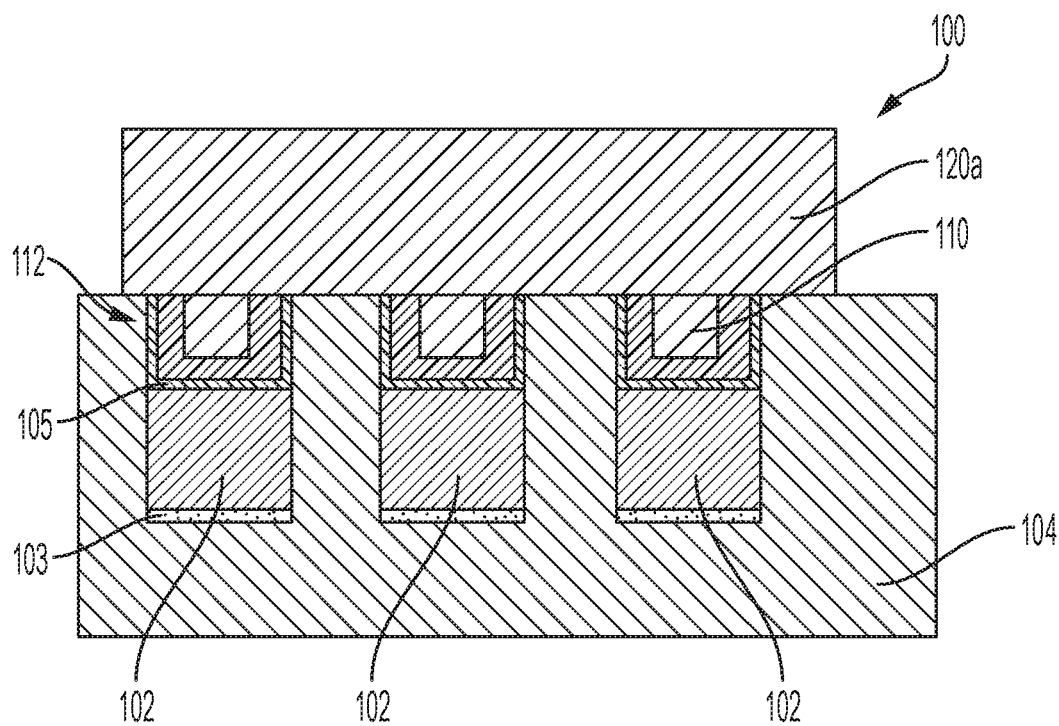
FIG. 6B illustrates the IC structure in the first cross-section view according to a non-limiting embodiment of the invention.
Figure 6C:
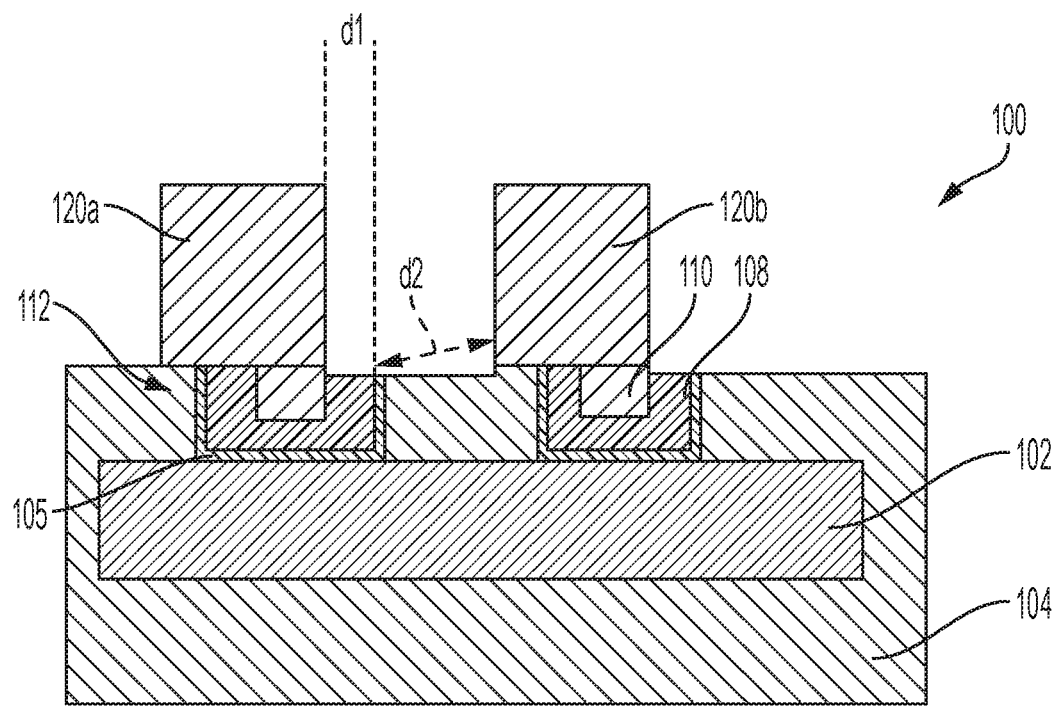
FIG. 6C illustrates the IC structure in the second cross-section view according to a non-limiting embodiment of the invention.

FIG. 6A depicts a top-down view of the IC structure 100, FIG. 6B depicts the IC structure 100 along a first cross-section view (i.e., line A-A of FIG. 6A), and FIG. 6C depicts the IC structure 100 along a second cross-section view (i.e., line B-B of FIG. 6A), all of which are after fabrication operations in accordance with embodiments of the invention. As best shown in FIGS. 6B and 6C, one or more metal lines 120a, 120b have been formed using the masking layer and pattern elements described above. A reactive ion etch (RIE) process that is selective to the dielectric layer 104 and the dual-metal via 112 can be performed to transfer the pattern into the third metal 114. In this manner, the conductive metal lines 120a and 120b are formed from the third metal 114.

The metal lines 120a and 120b extend along the X-axis, thereby intersecting and directly contacting the upper surface of one or more of the dual-metal vias 112. In one or more non-limiting embodiments of the invention, the metal lines 120a and 120b have a length (i.e., extending along the X-axis) that ranges, for example, from about 10 nm to about 0.01 millimeters (mm) and a width (i.e., extending along the Y-axis) that ranges, for example, from about 8 nm to about 20 nm.

Due to misalignment of the pattern elements that occur when performing the line patterning process described above, the resulting metal lines 120a and 120b can be misaligned (i.e., offset) by a distance (d1) with respect to the first metal 108 defining the sidewalls of the underlying dual-metal vias 112. The misaligned distance (d1) can range, for example, from about 2 nm to about 12 nm.

As best shown in FIG. 6C, the misaligned metal lines 120a and 120b define a first distance (d2) between a dual-metal via 112 and an adjacent metal line 120a or 120b. For example, FIG. 6C shows the sidewall (e.g., the first metal 108) of the dual-metal via 112 beneath the first metal line 120a separated from the sidewall of adjacent metal line 120b by a first distance (d2). When current flows through the IC structure 100, the distance (d2) defines a field strength of an electrical field generated between the dual-metal via 112 and the adjacent metal line 120b.

Figure 7A:
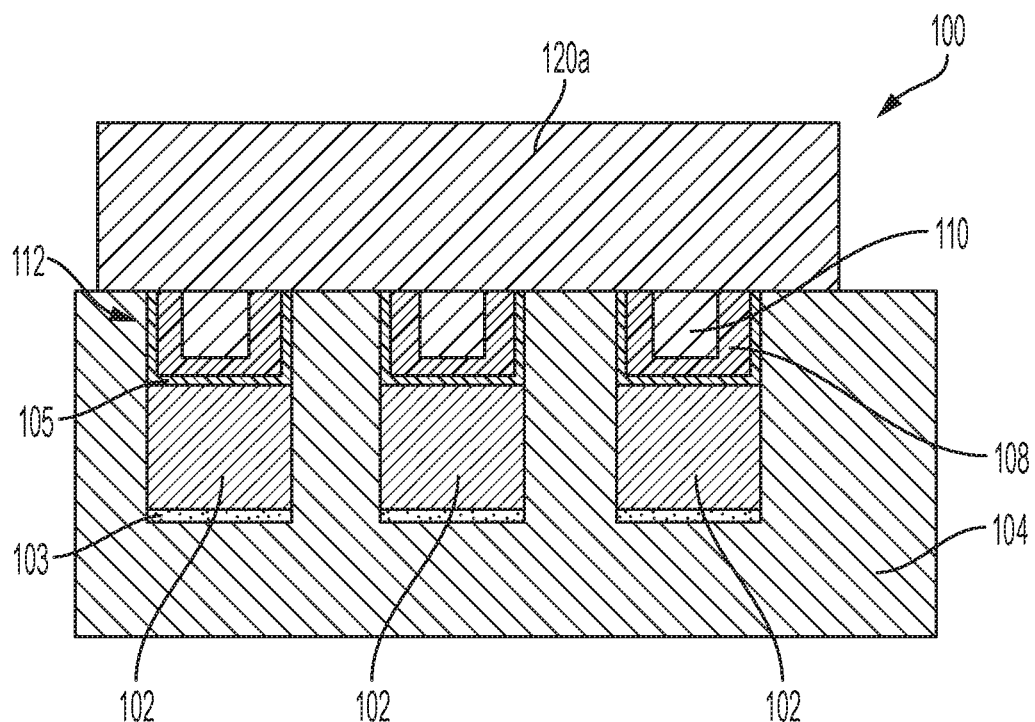
FIG. 7A illustrates the IC structure in the first cross-section view after etching a portion of the first metal of the dual-metal conductive via according to a non-limiting embodiment of the invention according to a non-limiting embodiment of the invention.
Figure 7B:
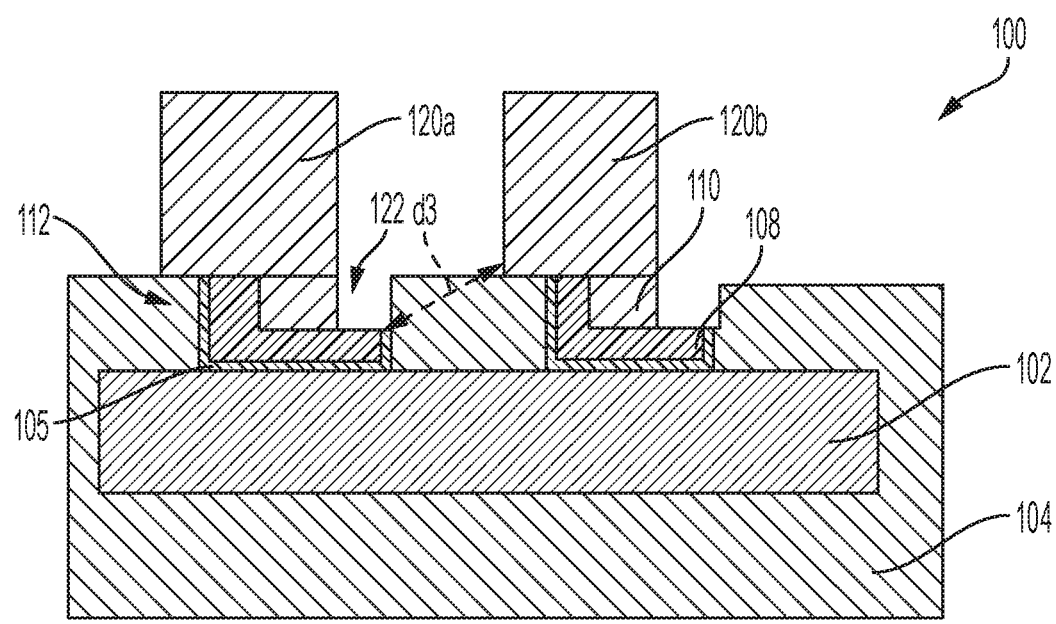
FIG. 7B illustrates the IC structure of FIG. 7A in the second cross-section view according to a non-limiting embodiment of the invention.

FIGS. 7A and 7B depict the IC structure 100 along the first cross-section view (i.e., line A-A of FIG. 6A) and the second cross-section view (i.e., line B-B of FIG. 6A) after fabrication operations in accordance with embodiments of the invention. As best shown in FIGS. 7A and 7B, the IC structure 100 is illustrated after etching a portion of the first metal 108 of the dual-metal via 112. In one or more embodiments of the invention, the exposed portion of the first metal 108 resulting from the overlay misalignment of the metal lines 120a and 120b can be dry etched or wet etched selective to the second metal 110 and the metal lines 120a and 120b. In one or more non-limiting embodiments of the invention where the first metal 108 includes cobalt (Co), for example, the exposed portion of the first metal 108 can be etched selective to the to the second metal 110 and the metal lines 120a and 120b using a wet etch process the employs a chemistry including tetraethylammonium hydroxide (TEAH), benzotriazole (BTA) and a deionized water rinse. In embodiments of the invention where the first metal 108 includes ruthenium (Ru), for example, the exposed portion of the first metal 108 can be etched selective to the to the second metal 110 and the metal lines 120a and 120b using a wet etch process the employs a chemistry including hydrochloric (HCl) acid, sulfuric (H2SO4) acid, nitric (HNO3) acid, or an alkaline solution such as ammonium hydroxide (NH4OH).

As best shown in FIG. 7B, etching the first metal 108 produces divots 122 in the dielectric layer 104. Accordingly, one sidewall of the dual-metal via 112 (i.e., the etched portion) has an etched surfaced that is recessed below a non-etched upper surface of the opposing sidewall (i.e., the non-etched portion) of the dual-metal via 112. As further shown in FIG. 7B, the divots 122 expose a side portion of the second metal 110 (i.e., the inner core). In one or more embodiments of the invention, the side portion of the second metal 110 (i.e., the inner core) is co-planar with a sidewall of the electrically conductive line 120a and 120b located above the respective the dual-metal via 112.

Still referring to FIG. 7B, etching the first metal 108 also increases the distance (d3) between the dual-metal via 112 (located beneath the first metal line 120a) and the adjacent metal line 120b. When current flows through the IC structure 100, this increased distance (d3) defines a field strength of an electrical field between the dual-metal via 112 and the adjacent metal line 120b that is less than the field strength that would be defined by the previous larger distance (d2). Because the increased distance (d3) results in a reduced field strength, TDDB failure of the IC structure 100 is also reduced.

Figure 8A:
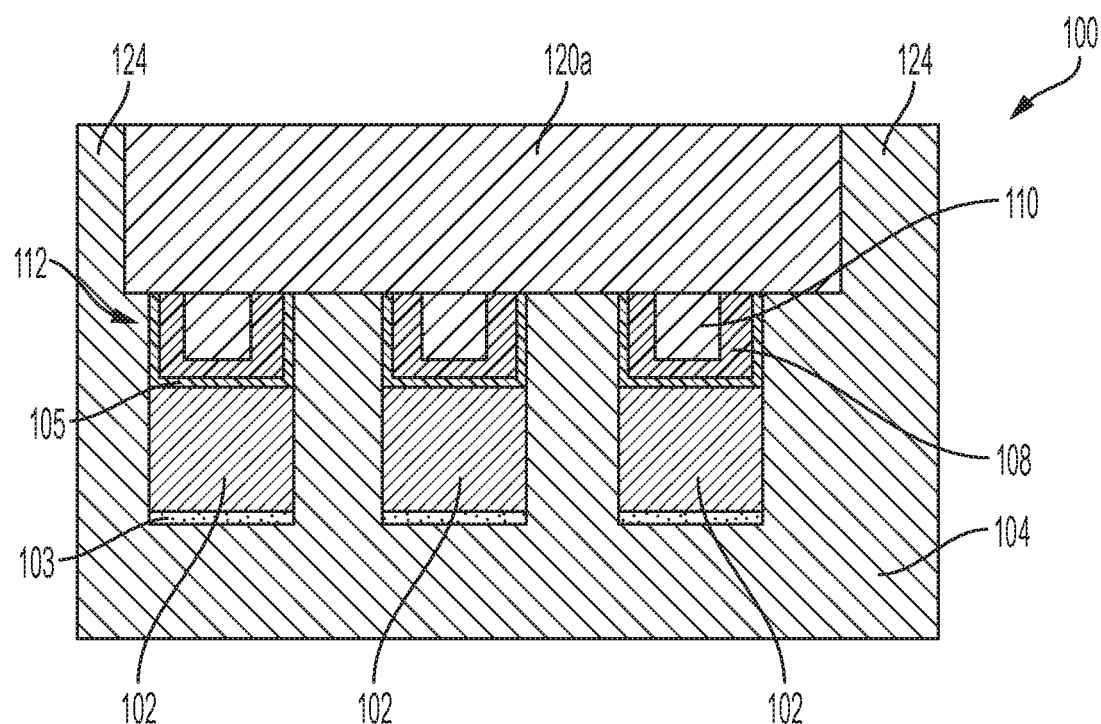
FIG. 8A illustrates the IC structure in the first cross-section view after depositing an ILD according to a non-limiting embodiment of the invention.
Figure 8B:
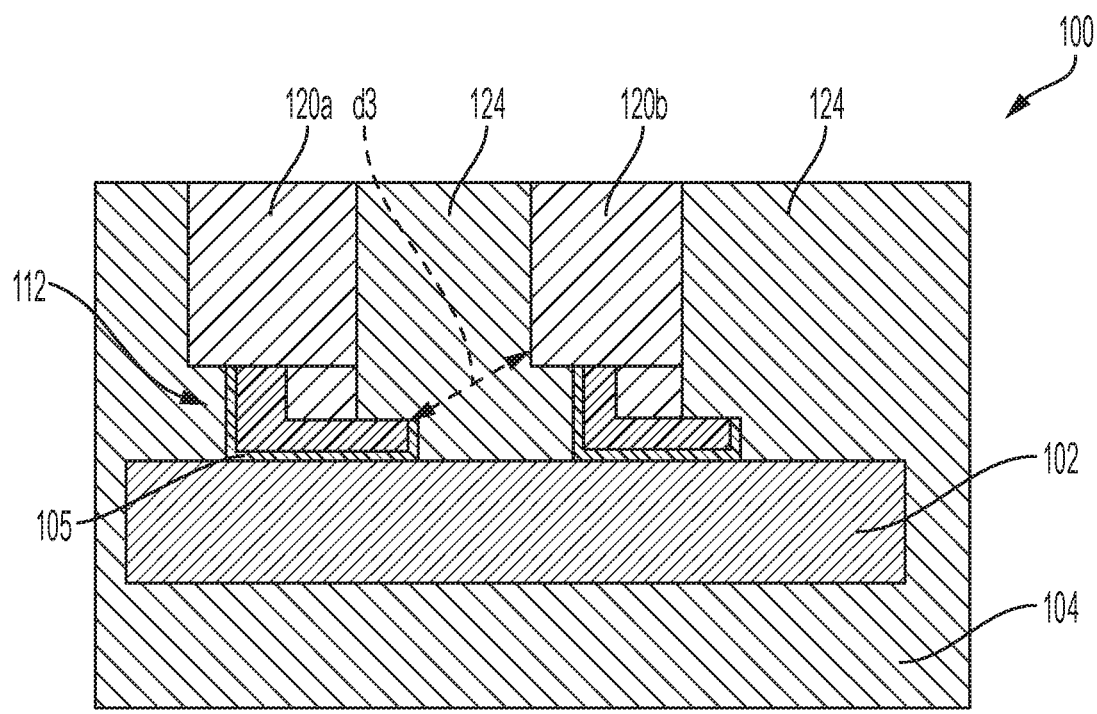
FIG. 8B illustrates the IC structure of FIG. 8A in the second cross-section view according to a non-limiting embodiment of the invention.

FIGS. 8A and 8B depict the IC structure 100 along the first cross-section view (i.e., line A-A of FIG. 6A) and the second cross-section view (i.e., line B-B of FIG. 6A) after fabrication operations in accordance with embodiments of the invention. As best shown in FIGS. 8A and 8B, the IC structure 100 is illustrated after depositing a dielectric material 124 on the upper surface of the dielectric layer 104. The dielectric material 124 can serve as an interlayer dielectric (ILD) and can include various dielectrics including, but not limited to, silicon dioxide ($SiO_2$). The dielectric material 124 fills the divots 122 (see FIG. 7B) encapsulate therein the plurality of dual-metal vias and the plurality of electrically conductive lines. In some embodiments of the invention, the dielectric material 124 can be overfilled to settle on the upper surface of the metal lines 120a and 120b. A CMP process can be performed such that the upper surface of the metal lines 120a and 120b are flush (i.e., co-planar) with the upper surface of the dielectric material 124. Accordingly, an IC structure 100 can be formed with dual-metal vias that facilitate increased distances between adjacent conductive elements (e.g., vias and metal lines). In this manner, TDDB failure of the IC structure 100 can be reduced.

As described herein, various non-limiting embodiments of the invention provide an IC structure including one or more metal lines formed on one or more underlying dual-metal vias. The dual-metal vias include a first metal that defines the via sidewalls, while a second metal forms the via core. The implementation of two different metals allows for etching a sidewall of the dual-metal via selective to the via core. Removing a portion of the sidewall increases the distance between the dual-metal via and a neighboring metal line, thereby reducing the electric field strength between the dual-metal via and the neighboring metal line. In this manner, TDDB failure of the IC structure can be reduced.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments of the invention can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an integrated circuit (IC), the method comprising:
   forming a plurality of dual-metal vias in a dielectric layer, the plurality of dual-metal vias including a first type of metal surrounding a second type of metal different from the first type of metal, and the plurality of dual-metal vias extending along a first axis to define a length and a second axis orthogonal to the first axis to define a width, a first dual-metal via among the plurality of dual-metal vias separated from a second dual-metal via among the plurality of dual-metal vias by a distance extending along the second axis;
   forming a plurality of electrically conductive lines on the dielectric layer, a first electrically conductive line among the plurality of electrically conductive lines extending along the first axis and on an upper surface of the first dual-metal via and a second electrically conductive line among the plurality of electrically conductive lines extending along the first axis and on an upper surface of the second dual-metal via; and
   etching a portion of the first dual-metal via to increase the distance separating the first dual-metal via from the second dual-metal via.

2. The method of claim 1, wherein etching the portion of the first dual-metal via includes etching the first type of metal selective to the second type of metal.

3. The method of claim 2, wherein the plurality of electrically conductive lines includes a third type of metal and wherein etching the portion of the first dual-metal via includes etching the first type of metal selective to the third type of metal.

4. The method of claim 3, wherein the third type of metal matches the second type of metal.

5. The method of claim 1, wherein etching the portion of the first dual-metal via forms divots in the dielectric layer that exposes a side portion of the second metal, and wherein the side portion of the second metal is co-planar with a sidewall of the first electrically conductive line formed on the upper surface of the first dual-metal via.

6. The method of claim 5 further comprising depositing a dielectric material to fill the divots and encapsulate therein the plurality of dual-metal vias and the plurality of electrically conductive lines.

7. A method of fabricating an integrated circuit (IC), the method comprising:
   forming first and second dual-metal vias in a dielectric layer that extends along a first axis to define a length and a second axis orthogonal to the first axis to define a width, the first dual-metal via separated from the second dual-metal via by a distance extending along the second axis, wherein the first and second dual-metal vias each include an inner core and sidewalls surrounding the inner core;
   forming a first electrically conductive line extending along the first axis and on an upper surface of the first dual-metal via and second electrically conductive line extending along the first axis and on an upper surface of the second dual-metal via; and
   etching a portion of the sidewalls selective to the inner core to increase the distance between the first dual-metal via and the second electrically conductive line.

8. The method of claim 7, wherein the sidewalls comprise a first metal and the inner core comprises a second metal different from the first metal.

9. The method of claim 8, wherein the first and second electrically conductive lines include a third type of metal.

10. The method of claim 9, wherein the third type of metal matches the second type of metal.

11. The method of claim 9 further comprising etching the portion of the sidewalls selective to the first and second electrically conductive lines.

12. The method of claim 7, wherein etching the portion of the sidewalls forms a first and second divots in the dielectric layer that exposes a side portion of the inner core of the first and second dual metal vias, respectively, and wherein the side portion of the inner core of the first dual-metal via is co-planar with a sidewall of the first electrically conductive line and the side portion of the inner core of the second dual-metal via is co-planar with a sidewall of the second electrically conductive line.

\* \* \* \* \*